(12) United States Patent
Zaltsman et al.

(10) Patent No.: US 9,696,918 B2
(45) Date of Patent: Jul. 4, 2017

(54) PROTECTION AND RECOVERY FROM SUDDEN POWER FAILURE IN NON-VOLATILE MEMORY DEVICES

(71) Applicant: APPLE INC., Cupertino, CA (US)

(72) Inventors: Etai Zaltsman, Herzlia Pituach (IL); Avraham Poza Meir, Herzlia Pituach (IL)

(73) Assignee: APPLE INC., Cupertino, CA (US)

( * ) Notice: Subject to any disclaimer, the term of this patent is extended or adjusted under 35 U.S.C. 154(b) by 460 days.

(21) Appl. No.: 14/523,979

(22) Filed: Oct. 27, 2014

(65) Prior Publication Data

US 2016/0011806 A1   Jan. 14, 2016

Related U.S. Application Data

(60) Provisional application No. 62/023,895, filed on Jul. 13, 2014.

(51) Int. Cl.
| | |
|---|---|
| *G06F 12/02* | (2006.01) |
| *G06F 3/06* | (2006.01) |
| *G11C 11/56* | (2006.01) |
| *G06F 11/14* | (2006.01) |
| *G11C 16/22* | (2006.01) |
| *G11C 27/00* | (2006.01) |

(52) U.S. Cl.
CPC .......... *G06F 3/0619* (2013.01); *G06F 3/0625* (2013.01); *G06F 3/0634* (2013.01); *G06F 3/0659* (2013.01); *G06F 3/0688* (2013.01); *G06F 11/1441* (2013.01); *G11C 11/5628* (2013.01); *G11C 16/22* (2013.01); *G11C 16/225* (2013.01); *G11C 27/005* (2013.01); *G11C 2211/5641* (2013.01)

(58) Field of Classification Search
CPC .... G06F 3/0619; G06F 3/0688; G06F 3/0659; G06F 3/0625; G06F 3/0634; G11C 11/5628; G11C 11/1441; G11C 16/22; G11C 16/225; G11C 27/005; G11C 2211/5641
See application file for complete search history.

(56) References Cited

U.S. PATENT DOCUMENTS

| | | | |
|---|---|---|---|
| 4,432,031 A | 2/1984 | Premerlani | |
| 5,799,200 A | 8/1998 | Brant et al. | |
| 5,959,926 A | 9/1999 | Jones et al. | |
| 6,134,148 A * | 10/2000 | Kawahara | G11C 11/5621 365/185.03 |
| 6,298,135 B1 | 10/2001 | Messerges et al. | |
| 6,424,569 B1 * | 7/2002 | Parker | G11C 11/5621 365/185.18 |

(Continued)

OTHER PUBLICATIONS

U.S. Appl. No. 12/497,707 Office Action dated Sep. 15, 2010.

*Primary Examiner* — Hiep Nguyen
(74) *Attorney, Agent, or Firm* — D.Kligler IP Services Ltd.

(57) ABSTRACT

A method for data storage includes, for a memory including groups of memory cells, defining a normal mode and a protected mode, wherein in the protected mode a respective analog value of each memory cell remains at all times unambiguously indicative of a respective data value stored in that memory cell. Data is initially stored in the memory using the normal mode. In response to an event, the protected mode is reverted to for at least one of the groups of the memory cells.

20 Claims, 3 Drawing Sheets

(56) References Cited

U.S. PATENT DOCUMENTS

| | | | |
|---|---|---|---|
| 6,549,457 B1 | 4/2003 | Srinivasan et al. | |
| 6,988,175 B2 | 1/2006 | Lasser | |
| 7,345,928 B2 | 3/2008 | Li | |
| 7,420,847 B2 | 9/2008 | Li | |
| 7,437,498 B2 | 10/2008 | Ronen | |
| 7,508,705 B2 | 3/2009 | Chae et al. | |
| 7,924,613 B1 | 4/2011 | Sommer et al. | |
| 7,990,765 B2 | 8/2011 | Park et al. | |
| 8,127,091 B2 | 2/2012 | Sarin et al. | |
| 8,174,905 B2 | 5/2012 | Shalvi et al. | |
| 8,291,209 B2 * | 10/2012 | Chong | G06F 9/445 713/2 |
| 8,493,781 B1 | 7/2013 | Meir et al. | |
| 8,537,612 B2 | 9/2013 | Kang | |
| 8,588,003 B1 | 11/2013 | Weingarten et al. | |
| 8,612,670 B2 | 12/2013 | Lyubman | |
| 8,644,099 B2 | 2/2014 | Cometti et al. | |
| 8,645,794 B1 | 2/2014 | Meir et al. | |
| 8,661,184 B2 | 2/2014 | Wood et al. | |
| 8,694,715 B2 | 4/2014 | Weingarten et al. | |
| 8,706,951 B2 | 4/2014 | Yang et al. | |
| 2005/0030693 A1 * | 2/2005 | Deak | G01R 31/3278 361/160 |
| 2005/0162916 A1 * | 7/2005 | Guterman | G11C 11/5628 365/185.22 |
| 2007/0006013 A1 | 1/2007 | Moshayedi et al. | |
| 2007/0143531 A1 | 6/2007 | Atri | |
| 2008/0089123 A1 | 4/2008 | Chae et al. | |
| 2009/0073762 A1 | 3/2009 | Lee et al. | |
| 2009/0089484 A1 | 4/2009 | Chu | |
| 2010/0091566 A1 * | 4/2010 | Sato | G11C 16/0483 365/185.03 |
| 2011/0022786 A1 * | 1/2011 | Yeh | G06F 12/0246 711/103 |
| 2012/0297116 A1 | 11/2012 | Gurgi | |
| 2013/0117606 A1 | 5/2013 | Anholt et al. | |
| 2014/0047162 A1 * | 2/2014 | Tanimoto | G06F 12/0246 711/103 |
| 2014/0089743 A1 | 3/2014 | Meir et al. | |
| 2016/0170671 A1 * | 6/2016 | Huang | G06F 3/0619 711/103 |

* cited by examiner

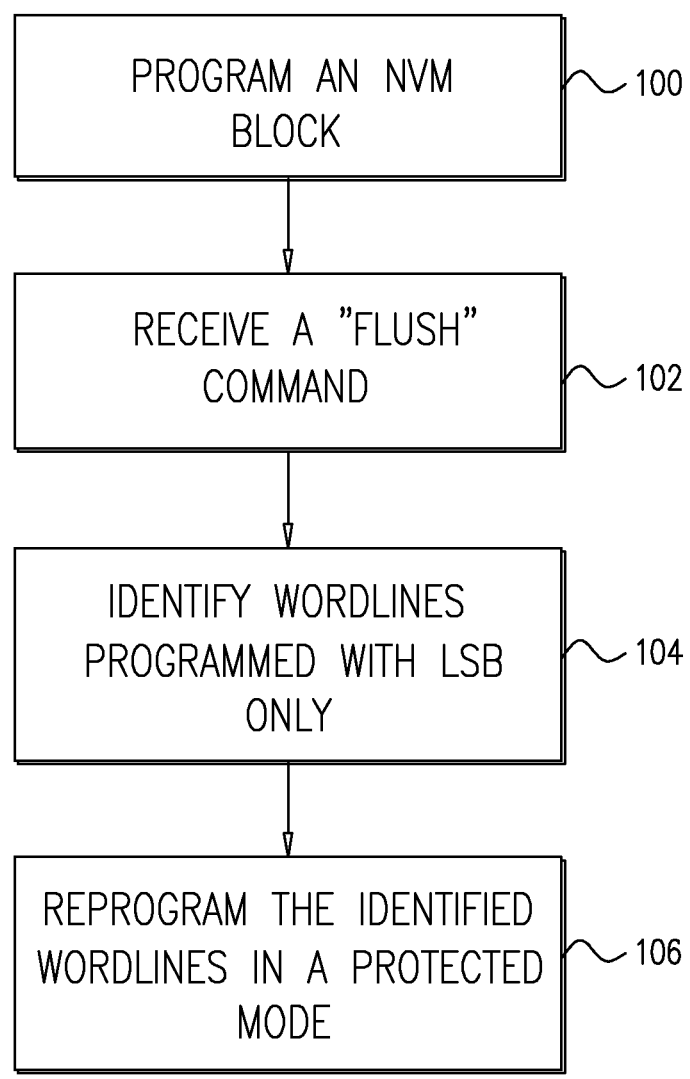

PROTECTION AND RECOVERY FROM SUDDEN POWER FAILURE IN NON-VOLATILE MEMORY DEVICES

CROSS-REFERENCE TO RELATED APPLICATIONS

This application claims the benefit of U.S. Provisional Patent Application 62/023,895, filed Jul. 13, 2014, whose disclosure is incorporated herein by reference.

TECHNICAL FIELD

Embodiments described herein relate generally to memory devices, and particularly to methods and systems for protection and recovery from power failures in non-volatile memory devices.

BACKGROUND

Non-volatile storage systems, such as a Solid State Drives (SSD), are typically expected to recover from sudden loss of electrical power with minimal loss of data. Examples of prior art techniques for protection against power interruption in non-volatile storage systems are provided below.

U.S. Pat. No. 7,924,613, to Sommer, et al., whose disclosure is incorporated herein by reference, describes a method for data storage including storing first data in analog memory cells using a first programming operation, which writes to the memory cells respective analog values representing respective bit values of the first data. Second data is stored in the analog memory cells in addition to the first data using a second programming operation, which modifies the respective analog values of the memory cells so as to represent bit value combinations of the first and second data. The first and second programming operations are defined such that, at all times during the second programming operation, the analog value of each memory cell remains unambiguously indicative of the respective bit value of the first data stored in that memory cell.

U.S. Pat. No. 7,990,765, to Park, et al., whose disclosure is incorporated herein by reference, describes a method for a Least Significant Bit (LSB) page recovery in a multi-level cell (MLC) flash memory device. The method includes setting first through $n^{th}$ LSB page groups (n being a natural number that is larger than 2) comprising at least two LSB pages from among the LSB pages included in the MLC flash memory.

U.S. Pat. No. 8,127,091, to Sarin, et al., whose disclosure is incorporated herein by reference, describes methods for data transfer and/or programming a memory device, memory devices and memory systems. According to at least one such method, additional data is appended to original data and the resulting data is programmed in a selected memory cell. The appended data increases the program threshold voltage margin of the original data.

U.S. Pat. No. 8,694,715, to Weingarten, et al., whose disclosure is incorporated herein by reference, describes a method for programming a plurality of data sequences into a corresponding plurality of flash memory functional units using a programming process having at least one selectable programming duration-controlling parameter controlling the duration of the programming process for a given data sequence. The method comprising providing at least one indication of at least one varying situational characteristic and determining a value for said at least one selectable programming duration-controlling parameter controlling the duration of the programming process for a given data sequence.

U.S. Pat. No. 8,706,951, to Yang, et al., whose disclosure is incorporated herein by reference, describes a method to detect an indication indicative of whether to program fast access pages or slow access pages of a flash memory. In response to the detected indication, data is programmed from a volatile memory: (1) to the fast access pages of the flash memory while skipping the slow access pages, or (2) to the slow access pages while skipping the fast access pages.

SUMMARY

An embodiment that is described herein provides a method for data storage including, for a memory including groups of memory cells, defining a normal mode and a protected mode, wherein in the protected mode a respective analog value of each memory cell remains at all times unambiguously indicative of a respective data value stored in that memory cell. Data is initially stored in the memory using the normal mode. In response to an event, the protected mode is reverted to for at least one of the groups of the memory cells.

In some embodiments, the method includes defining at least a first programming operation that stores first data in a given group of the memory cells by writing to the memory cells respective analog values representing respective bit values of the first data, and a second programming operation that stores in the given group second data in addition to the first data by modifying the respective analog values of the memory cells in the given group so as to represent bit value combinations of the first and second data, such that, at all times during execution of the second programming operation in the protected mode, the analog value of each memory cell remains unambiguously indicative of the respective bit value of the first data stored in that memory cell.

In a disclosed embodiment, storing the data includes configuring the first programming operation so as to program the memory cells with normal analog values when operating in the normal mode, and with protected analog values, different from the normal analog values, when operating in the protected mode. In an example embodiment, reverting to the protected mode includes identifying one or more groups of the memory cells that have been programmed only with the first data, and modifying the analog values in the memory cells of the identified groups from the normal analog values to the protected analog values.

In another embodiment, the method includes reading the data from the groups that are programmed in the normal mode using first read thresholds, and reading the data from the groups that are programmed in the protected mode using second read thresholds that are different from the first read thresholds. In an embodiment, the event includes reception of a flush command. The method may include acknowledging the flush command only after reverting to the protected mode.

There is additionally provided, in accordance with an embodiment that is described herein, a data storage apparatus including a memory and a processor. The memory includes groups of memory cells, The processor is configured to define a normal mode and a protected mode, wherein in the protected mode a respective analog value of each memory cell remains at all times unambiguously indicative of a respective data value stored in that memory cell, to initially store data in the memory using the normal mode, and, in response to an event, to revert to the protected mode for at least one of the groups of the memory cells.

There is additionally provided, in accordance with an embodiment that is described herein, a system including a host and a storage device. The storage device includes a memory including groups of memory cells, and a processor. The processor is configured to define a normal mode and a protected mode, wherein in the protected mode a respective analog value of each memory cell remains at all times unambiguously indicative of a respective data value stored in that memory cell, to initially store data in the memory using the normal mode, and, in response to an event, to revert to the protected mode for at least one of the groups of the memory cells.

These and other embodiments will be more fully understood from the following detailed description of the embodiments thereof, taken together with the drawings in which:

BRIEF DESCRIPTION OF THE DRAWINGS

FIG. 3 is a flow chart that schematically illustrates a method for protection and recovery from power failures in non-volatile memory devices, in accordance with embodiment that is described herein.

DETAILED DESCRIPTION OF EMBODIMENTS

Overview

Figure 1:
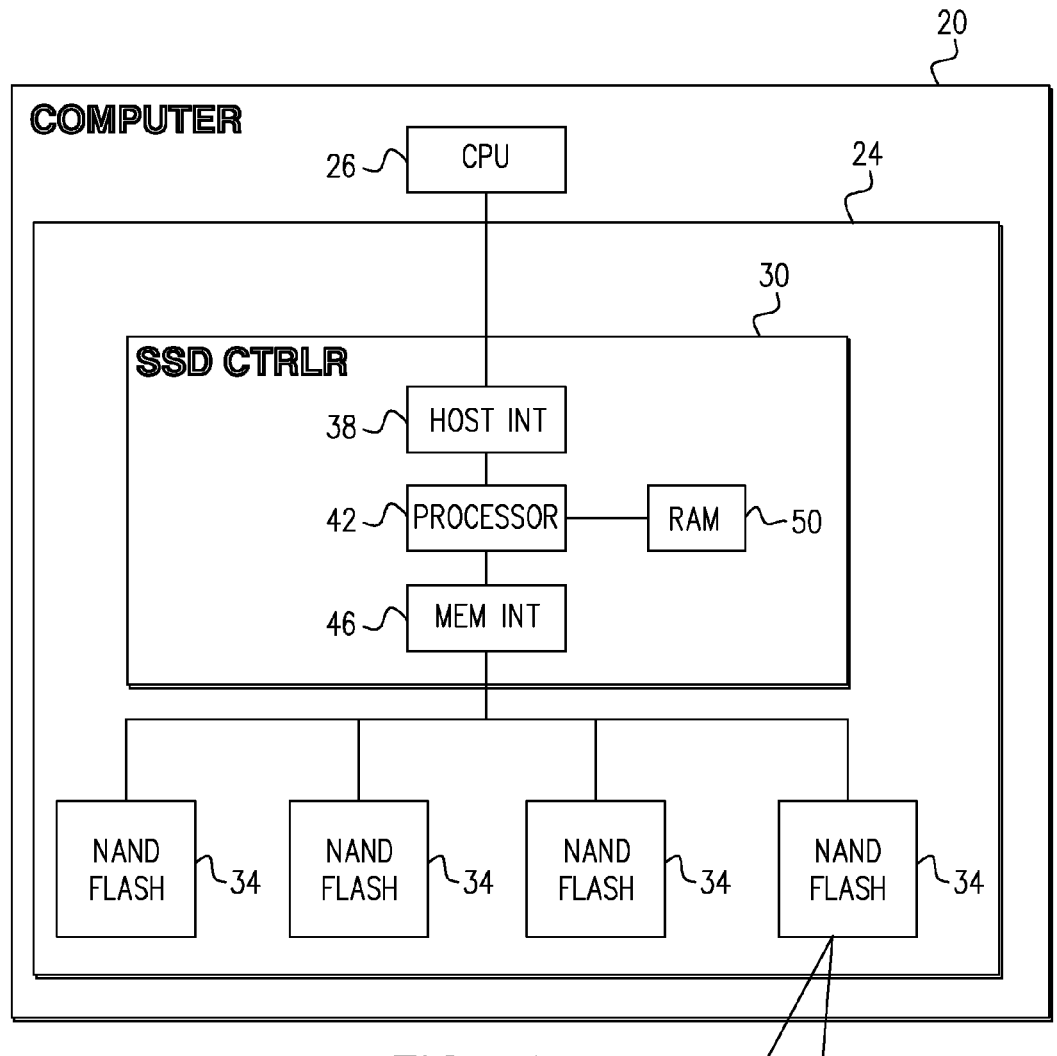
FIG. 1 is a block diagram that schematically illustrates a memory system, in accordance with an embodiment that is described herein.
Figure 1:
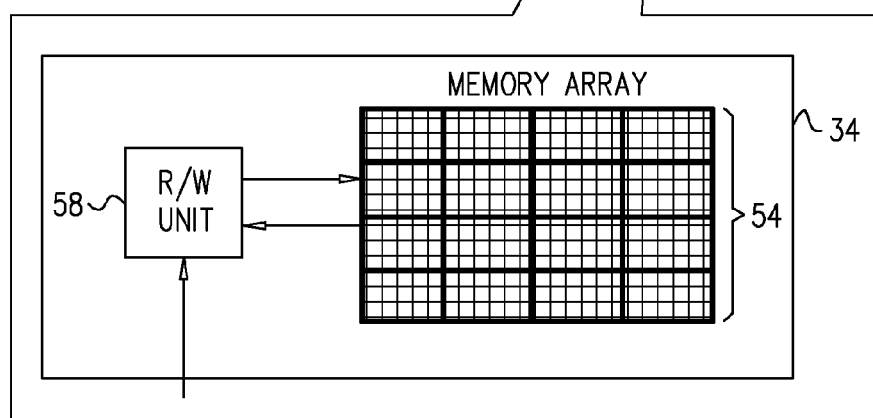

Non-volatile storage devices that are based on analog memory cells, such as Flash memory devices, typically store data by programming the memory cells to assume certain programming levels, i.e., voltages that represent the data. If the programming operation is disrupted, such as due to a power failure, the stored data may be lost or corrupted.

Multi-Level Cell (MLC) devices are able to store data at multiple voltage levels, and so are able to store multiple data bits in each memory cell. MLC devices are consequently particularly sensitive to programming interruption. In many practical cases, different bits in a given multi-level cell may belong to different data items and may be stored at different times. For example, a given data file may be stored in the Least Significant Bits (LSBs) of a certain group of multi-level memory cells, and another file may be stored in the Most Significant Bits (MSBs) of these memory cells at a later time.

If an MSB programming operation is interrupted, the analog values (e.g., threshold voltages) of the cells may be distorted, and this distortion may corrupt both the LSB data and the MSB data. The corruption of the currently-written data (into the MSBs) may be permissible in some applications, but corruption of the LSBs (which may belong to another data item and may have been written at a much earlier time) is highly undesirable.

From a programming perspective, a four-level MLC may be in one of the following three states: not programmed at all (neither MSB, nor LSB), programmed at both LSB and MSB, and partially programmed, i.e., programmed with only LSB. The first two states are not affected by a power failure, however the third state is vulnerable to power failures after the LSB is programmed and during the MSB programming.

Embodiments that are described herein provide improved methods and systems for storing data in multi-level analog memory cells. These methods and systems reduce the effects of programming interruptions by confining possible corruption to the currently-written data, and ensuring that data written to other bits of the memory cells in previous programming operations is not lost.

In some embodiments, a storage system comprises a memory controller and at least one memory device comprising multi-level memory cells. The memory controller programs groups of the multi-level memory cells, e.g., word lines, using at least two types of programming operations. The first programming operation programs first bits of the memory cells (e.g., the LSBs). The second programming operation programs second bits of the memory cells (e.g., the MSBs) in addition to the first bits, i.e., after the first bits are already programmed. In other words, the second programming operation shifts the analog values of the memory cells from one set of programming levels to another set of levels. In the disclosure and in the claims, a set of programming levels is also referred to as a constellation of programming levels. In a typical application, programming is performed using an iterative Program and Verify (P&V) sequence.

In some embodiments, the memory controller and memory device support two modes of operation, referred to as a "normal mode" and a "protected mode." In the protected mode, the programming-level constellations are designed so that at any time during the second programming operation, the analog value of each memory cell remains unambiguously indicative of the first bit value stored in that memory cell. As a result, if the second programming operation (e.g., MSB programming) is interrupted for any reason, the data stored in the first programming operation (e.g., LSB data) will still be recoverable. In the normal mode, the above condition is not necessarily maintained, and ambiguity is permitted.

The programming-level constellations of the protected mode typically incur higher programming time and may degrade other performance measures of the memory device, in comparison with the normal mode. For this reason, the memory controller reverts to the protected mode only when necessary, for example, upon receiving a "flush" command from a host. Typically, a flush command is sent by the host or another entity, to a memory controller when a system has an indication of an approaching power failure. The flush command instructs the memory controller to immediately save of all data that is stored in the RAM (volatile memory), into a non-volatile memory (NVM). At other times, the system operates in the normal mode. As a result, performance degradation, if any, occurs only for a limited period of time.

A flush command may also be sent by the host in order to ensure that certain data is not lost during a power failure, for example to ensure coherency when updating file meta-data after writing the data of the file. Such coherency checkpoints typically take place only after the system has written a certain amount of data, during which the system operates in normal mode.

In an example embodiment, the normal and protected modes differ from one another in the programming-level constellation of the first bits. In a typical mode of operation, the memory controller stores data in the various word lines using conventional first and second programming operations (e.g., LSB and MSB write and read commands). Upon receiving a "flush" command, and before acknowledging the command, the memory controller identifies the word lines in which only the first bits (e.g., LSB) and not the second bits (e.g., MSB) are programmed. The memory controller then re-programs the identified word lines to the programming-level constellation of the protected mode.

The methods and systems described herein are highly effective in protecting the stored data against power interruption. At the same time, the disclosed techniques minimize the performance degradation that may be caused by the protected mode.

System Description

FIG. 1 is a block diagram that schematically illustrates a host system that stores data in a memory system, in accordance with an embodiment that is described herein. In the present example the host system is assumed to comprise a computer 20 that stores data in a Solid State Drive (SSD) 24.

In alternative embodiments, the host system may comprise, for example, a computing device, a cellular phone or other communication terminal, a removable memory module ("USB Flash Drive," memory card or similar device), a digital camera, a music or other media player and/or any other system or device in which data is stored and retrieved.

In the present example, computer 20 comprises a Central Processing Unit (CPU) 26 that stores data in SSD 24. SSD 24 comprises an SSD controller 30 that stores data on behalf of CPU 26 in multiple non-volatile memory devices, in the present example NAND Flash devices 34. Any suitable number of memory devices 34 can be used. SSD controller 30 comprises a host interface 38 for communicating with CPU 26, a processor 42 that carries out the various processing tasks of the SSD, a memory interface 46 for communicating with memory devices 34, and a Random Access Memory (RAM) 50. Each memory device 34 comprises a memory array 54 of analog memory cells, and a Read/Write (R/W) unit 58 that programs, reads and erases the memory cells in array 54.

In the context of the present patent application, the term "analog memory cell" is used to describe any memory cell that holds a continuous, analog value of a physical parameter, such as an electrical voltage or charge. Array 54 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. R/W unit 58 stores data in the analog memory cells by programming the cells to assume respective programming states, which are also referred to as programming levels. The programming states are selected from a finite set of possible states, and each programming state corresponds to a certain nominal storage value. For example, a 3 bit/cell Multi-Level Cell (MLC) can be programmed to assume one of eight possible programming states by writing one of eight possible nominal storage values into the cell.

Typically, R/W unit 58 converts data for storage in the memory device to analog storage values and writes them into the memory cells. In alternative embodiments, the R/W unit does not perform the conversion, but is provided with voltage samples, i.e., with the storage values for storage in the cells. When reading data out of array 54, R/W unit 58 converts the storage values of the memory cells into digital samples having a resolution of one or more bits. Data is typically written to and read from the memory cells in groups that are referred to as pages. In some embodiments, the R/W unit can typically erase a group of cells by applying one or more negative erasure pulses to the cells. Erasure is typically performed in entire memory blocks.

SSD controller 30, and in particular processor 42, may be implemented in hardware. Alternatively, the SSD controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the disclosed techniques, such as various interfaces, addressing circuits, timing and sequencing circuits and debugging circuits, have been omitted from the figure for clarity.

In the exemplary system configuration shown in FIG. 1, memory devices 34 and SSD controller 30 are implemented as separate Integrated Circuits (ICs). In alternative embodiments, however, the memory devices and the SSD controller may be integrated on separate semiconductor dies in a single Multi-Chip Package (MCP) or System on Chip (SoC), and may be interconnected by an internal bus. Further alternatively, some or all of the SSD controller circuitry may reside on the same die on which the memory array is disposed. Yet further alternatively, some or all of the functionality of SSD controller 30 can be implemented in software and carried out by a processor or other element of the host system. In some embodiments, CPU 26 and SSD controller 30 may be fabricated on the same die, or on separate dies in the same device package.

In some embodiments, SSD controller 30 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory. SSD controller 30 is also referred to herein as a memory controller.

In an example configuration of array 54, the memory cells are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In some embodiments, the memory cells are arranged in a three-dimensional (3D) configuration.

Typically, memory controller 30 programs data in page units, but erases entire memory blocks. Typically although not necessarily, a memory block is on the order of $10^7$ memory cells, whereas a page is on the order of $10^4$-$10^5$ memory cells. In some embodiments, a given memory die comprises multiple memory arrays that are referred to as planes, and it is possible to program multiple pages into multiple respective planes in parallel.

Protected Mode for Protection and Recovery from Power Loss

Figure 2:
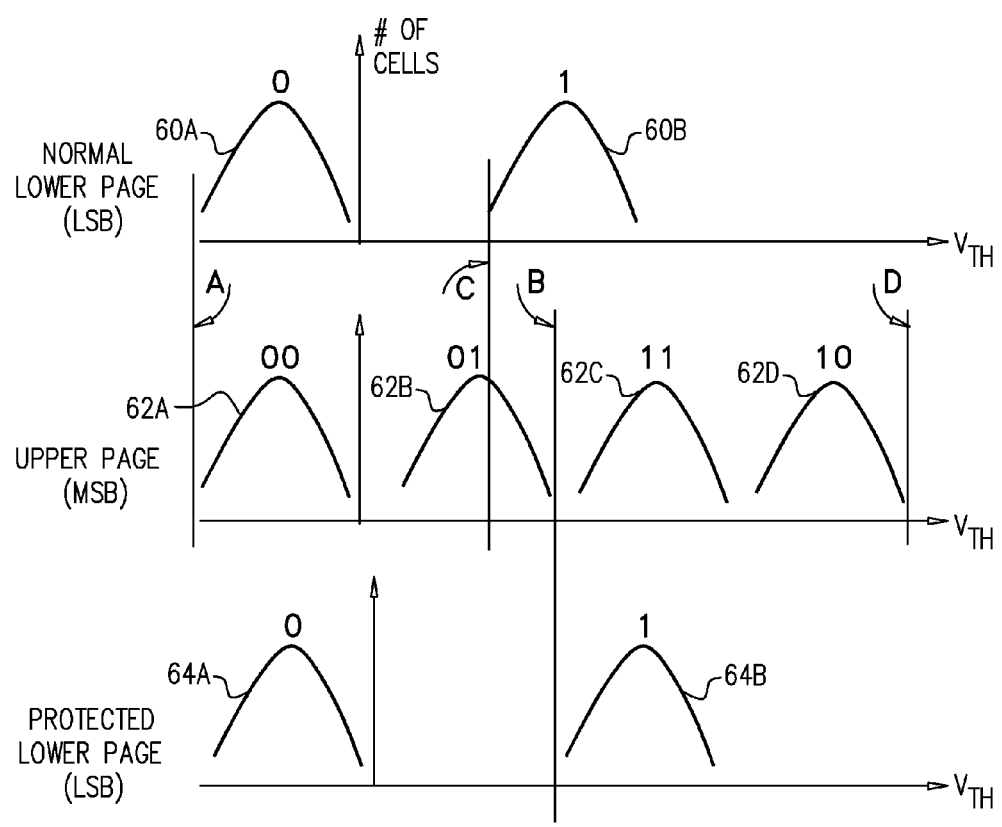
FIG. 2 is a diagram that schematically illustrates programming levels in a group of multi-level analog memory cells, in accordance with an embodiment that is described herein.

FIG. 2 illustrates programming levels in a group of memory cells in a normal and in a protected mode, in accordance with an embodiment that is described herein. These programming levels are used by SSD controller 30 in programming memory devices 34. In all graphs, the horizontal axis represents the cell threshold voltage ($V_{TH}$) and the vertical axis represents the relative number of memory cells having that $V_{TH}$.

The top graph in FIG. 2 shows the programming-level distribution of a word line that is programmed with only the lower page (LSB page), in the normal mode. Memory cells that store LSB="0" are set to programming level 60A marked "0", and memory cells that store LSB="1" are set to a programming level 60B marked "1".

The middle graph shows the programming-level distribution of a word line that is programmed with both the lower page (LSB page) and the upper page denoted the Most Significant Bit (MSB) page. Memory cells that store LSB="0" and MSB="0" are set to a programming level 62A marked "00", memory cells that store LSB="0" and MSB="1" are set to a programming level 62B marked "01", memory cells that store LSB="1" and MSB="1" are set to a programming level 62C marked "11", and memory cells that store LSB="1" and MSB="0" are set to a programming level 62D marked "10".

As can be seen in the figure, during programming of the memory cells with the MSB page (during transition from the top graph to the middle graph), a memory cell that holds LSB="0" may have a $V_{TH}$ that falls anywhere between the lines denoted A and B. A memory cell that holds LSB="1", on the other hand, may have a $V_{TH}$ that falls anywhere between the lines denoted C and D.

Note that the $V_{TH}$ intervals [A,B] and [C,D] partially overlap. Therefore, following loss of power, if a memory cell is found to have a $V_{TH}$ that falls in the overlap region between line C and line B, it is impossible to determine whether the LSB value of this cell was "0" or "1".

In order to overcome this problem, the protected mode uses a different programming-level constellation for the LSB page. This constellation is shown at the bottom graph of FIG. 2. In this constellation, programming level 64A that represents LSB="0" is located at the same threshold voltage range as programming level 60A, but programming level 64B that represents LSB="1" is located above (in terms of threshold voltage) line B. The MSB programming-level constellation is unchanged.

As a result, following loss of power during MSB programming, $V_{TH}$ that falls below line B is indicative without ambiguity of LSB="0", and $V_{TH}$ that falls above line B is indicative without ambiguity of LSB="1". Thus, the LSB data can be recovered without error, even though the MSB data may be corrupted.

The mapping of bit values to programming levels and the programming-level constellations shown in FIG. 2 are chosen purely by way of example. In alternative embodiments, any other suitable programming-level constellations can be used for the normal and protected modes, and any other suitable mapping can be defined to map bit values to programming levels.

Because of the different programming levels, reading the LSB page from a word line that is programmed in the protected mode may require a different read threshold than a word line that is programmed in the normal mode. In some embodiments, the SSD controller supports two different LSB read threshold values, one for the normal mode and another for the protected mode.

The example of FIG. 2 refers to four-level MLC, in which each memory cell stores two data bits. This configuration, however, is chosen purely for the sake of conceptual clarity. In alternative embodiments, the disclosed techniques can be used, mutatis mutandis, in various other types of MLCs. For example, in eight-level MLC, also referred to as Triple-Level Cell (TLC), each group of cells may store up to three memory pages using eight programming levels. These pages are sometimes referred to as LSB, MSB and Upper Significance Bit (USB) pages, in ascending order of programming. The disclosed techniques can be used to protect against loss of LSB data during programming of an MSB page, and/or to protect against loss of MSB and LSB data during programming of a USB page.

Selective Application of Protected Mode

As can be seen in FIG. 2, the LSB programming level of LSB="1" in the protected mode (64B) uses higher $V_{TH}$ than the corresponding programming level in the normal mode (60B). The higher $V_{TH}$ has undesired effects. For example, LSB programming time in the protected mode will typically be longer than in the normal mode. Moreover, higher $V_{TH}$ may increase cell wear-out and interference to neighboring cells.

Therefore, in some embodiments, SSD controller 30 applies the protected mode selectively, in response to a suitable event. Such an event may comprise, for example, a "flush" command from CPU 26 (which acts as a host in this embodiment) that requests the SSD to transfer its volatile data to non-volatile memory. Alternatively, SSD controller 30 may revert to the protected mode in response to any other suitable event.

Typically, in response to the "flush" command or other event, the SSD controller identifies the word lines that are programmed with LSB only. The SSD controller then re-programs the identified word lines to the protected mode. After completing the re-programming operation, the SSD controller may proceed with MSB programming operations as desired, even though loss of power may occur. The SSD controller typically acknowledges the flush command to CPU 26 only after completing the re-programming operation.

SSD controller 30 may use various techniques for identifying which word lines are programmed with LSB only. In an example embodiment, controller 30 documents the programming state of each group of cells, such as word line, in a suitable data structure in RAM 50. In another embodiment, every word line (or another group of cells) comprises one or more "flag cells" that indicate the programming state of the respective word line and may provide additional indications for fast mapping by controller 30.

With reference to FIG. 2, the re-programming operation can be viewed as a transition from the programming-levels 60A and 60B of the top graph to the programming-levels 64A and 64B of the bottom graph. This operation involves increasing the charge levels of the memory cells whose LSB="1", while the cells whose LSB="0" remain unchanged.

FIG. 3 is a flow chart that schematically illustrates a method for protection and recovery from power failures in non-volatile memory devices, in accordance with an embodiment that is described herein.

The method begins with processor 42 of SSD controller 30 programming an NVM block, at an NVM block programming step 100. At a flush receiving step 102, processor 42 receives from CPU 26 a flush command due to a power failure or another event in computer 20. In response to the flush command, at an identification step 104, processor 42 identifies word lines that are programmed with LSB only, and at a reprogramming step 106, processor 42 reprograms the identified word lines to the protected mode. Processor 42 typically sends CPU 26 an acknowledgement for the flush command after completing step 106. At this point the partially-programmed word lines are protected from power failure.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
   for a memory comprising groups of memory cells, defining a normal mode and a protected mode, wherein in the protected mode a respective analog value of each memory cell remains at all times unambiguously indicative of a respective data value stored in that memory cell;
   initially storing data in the memory using the normal mode; and
   in response to an event, reverting to the protected mode for at least one of the groups of the memory cells.

2. The method according to claim 1, further comprising:
   defining at least a first programming operation that stores first data in a given group of the memory cells by writing to the memory cells respective analog values representing respective bit values of the first data; and
   defining at least a second programming operation that stores in the given group second data in addition to the first data by modifying the respective analog values of the memory cells in the given group so as to represent bit value combinations of the first and second data, such that, at all times during execution of the second programming operation in the protected mode, the analog value of each memory cell remains unambiguously indicative of the respective bit value of the first data stored in that memory cell.

3. The method according to claim 2, wherein storing the data comprises configuring the first programming operation to program the memory cells with normal analog values when operating in the normal mode, and to program the memory cells with protected analog values, different from the normal analog values, when operating in the protected mode.

4. The method according to claim 3, wherein reverting to the protected mode comprises identifying one or more groups of the memory cells that have been programmed only with the first data, and modifying the analog values in the memory cells of the identified groups from the normal analog values to the protected analog values.

5. The method according to claim 1, further comprising:
   reading the data from the groups that are programmed in the normal mode using first read thresholds; and
   reading the data from the groups that are programmed in the protected mode using second read thresholds that are different from the first read thresholds.

6. The method according to claim 1, wherein the event comprises reception of a flush command.

7. The method according to claim 6, further comprising acknowledging the flush command only after reverting to the protected mode.

8. A data storage apparatus, comprising:
   a memory comprising groups of memory cells; and
   a processor, which is configured to define a normal mode and a protected mode, wherein in the protected mode a respective analog value of each memory cell remains at all times unambiguously indicative of a respective data value stored in that memory cell, to initially store data in the memory using the normal mode, and, in response to an event, to revert to the protected mode for at least one of the groups of the memory cells.

9. The apparatus according to claim 8, wherein the processor is configured to:
   define at least a first programming operation that stores first data in a given group of the memory cells by writing to the memory cells respective analog values representing respective bit values of the first data; and
   define a second programming operation that stores in the given group second data in addition to the first data by modifying the respective analog values of the memory cells in the given group so as to represent bit value combinations of the first and second data,
   wherein, at all times during execution of the second programming operation in the protected mode, the analog value of each memory cell remains unambiguously indicative of the respective bit value of the first data stored in that memory cell.

10. The apparatus according to claim 9, wherein the processor is configured to configure the first programming operation so as to program the memory cells with normal analog values when operating in the normal mode, and with protected analog values, different from the normal analog values, when operating in the protected mode.

11. The apparatus according to claim 10, wherein the processor is configured to identify one or more groups of the memory cells that have been programmed only with the first data, and to modify the analog values in the memory cells of the identified groups from the normal analog values to the protected analog values.

12. The apparatus according to claim 8, wherein the processor is configured to read the data from the groups that are programmed in the normal mode using first read thresholds, and to read the data from the groups that are programmed in the protected mode using second read thresholds that are different from the first read thresholds.

13. The apparatus according to claim 8, wherein the event comprises reception of a flush command.

14. The apparatus according to claim 13, wherein the processor is configured to acknowledge the flush command only after reverting to the protected mode.

15. A system, comprising:
a host; and
a storage device, comprising:
a memory comprising groups of memory cells; and
a processor configured to define a normal mode and a protected mode, wherein in the protected mode a respective analog value of each memory cell remains at all times unambiguously indicative of a respective data value stored in that memory cell, to initially store data in the memory using the normal mode, and, in response to an event, to revert to the protected mode for at least one of the groups of the memory cells.

16. The system according to claim 15, wherein the processor is configured to:
define at least a first programming operation that stores first data in a given group of the memory cells by writing to the memory cells respective analog values representing respective bit values of the first data; and
define a second programming operation that stores in the given group second data in addition to the first data by modifying the respective analog values of the memory cells in the given group so as to represent bit value combinations of the first and second data,
wherein, at all times during execution of the second programming operation in the protected mode, the analog value of each memory cell remains unambiguously indicative of the respective bit value of the first data stored in that memory cell.

17. The system according to claim 16, wherein the processor is configured to configure the first programming operation so as to program the memory cells with normal analog values when operating in the normal mode, and with protected analog values, different from the normal analog values, when operating in the protected mode.

18. The system according to claim 17, wherein the processor is configured to identify one or more groups of the memory cells that have been programmed only with the first data, and to modify the analog values in the memory cells of the identified groups from the normal analog values to the protected analog values.

19. The system according to claim 15, wherein the processor is configured to read the data from the groups that are programmed in the normal mode using first read thresholds, and to read the data from the groups that are programmed in the protected mode using second read thresholds that are different from the first read thresholds.

20. The system according to claim 15, wherein the event comprises reception of a flush command from the host.

* * * * *